United States Patent
Sugahara et al.

(10) Patent No.: US 10,933,532 B2
(45) Date of Patent: Mar. 2, 2021

(54) SUBSTRATE CONVEYING ROBOT AND OPERATION METHOD THEREFOR

(71) Applicant: KAWASAKI JUKOGYO KABUSHIKI KAISHA, Kobe (JP)

(72) Inventors: Junichi Sugahara, Akashi (JP); Masaya Yoshida, Himeji (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 15/550,832

(22) PCT Filed: Feb. 13, 2015

(86) PCT No.: PCT/JP2015/053970
§ 371 (c)(1),
(2) Date: Aug. 14, 2017

(87) PCT Pub. No.: WO2016/129102
PCT Pub. Date: Aug. 18, 2016

(65) Prior Publication Data
US 2018/0029237 A1 Feb. 1, 2018

(51) Int. Cl.
*B25J 9/16* (2006.01)
*B25J 13/08* (2006.01)
(Continued)

(52) U.S. Cl.
CPC ......... *B25J 9/1697* (2013.01); *B25J 11/0095* (2013.01); *B25J 13/08* (2013.01);
(Continued)

(58) Field of Classification Search
CPC ...... B25J 13/08; B25J 9/1697; B25J 11/0095; B25J 15/0616; B25J 19/021;
(Continued)

(56) References Cited

U.S. PATENT DOCUMENTS

2004/0249507 A1* 12/2004 Yoshida ............ H01L 21/67265
700/245
2009/0259337 A1 10/2009 Harrold et al.
(Continued)

FOREIGN PATENT DOCUMENTS

JP H8-340040 A 12/1996
JP H11-176907 A 7/1999
(Continued)

OTHER PUBLICATIONS

May 19, 2015 International Search Report issued in International Patent Application No. PCT/JP2015/053970.

*Primary Examiner* — Stephen Holwerda
(74) *Attorney, Agent, or Firm* — Oliff PLC

(57) ABSTRACT

A substrate conveying robot has a robot arm including an end effector having a substrate holding unit holding a substrate, arm drive unit for driving the robot arm, an elevating drive unit for elevatingly driving the end effector, a robot control unit controlling the arm drive unit, the elevating drive unit, and the substrate holding unit, and a substrate detection unit having a substrate detection unit which detects a vertical position of the substrate and elevates coordinately with an elevating operation of the end effector. By this configuration, a vertical position of a substrate to be conveyed is detected with high accuracy so that a robot operation can be controlled based on the detection result.

13 Claims, 10 Drawing Sheets

(51) Int. Cl.
  *B25J 19/02* (2006.01)
  *H01L 21/677* (2006.01)
  *H01L 21/687* (2006.01)
  *H01L 21/67* (2006.01)
  *B25J 11/00* (2006.01)
  *B25J 15/06* (2006.01)

(52) U.S. Cl.
  CPC ......... *B25J 15/0616* (2013.01); *B25J 19/021* (2013.01); *H01L 21/67259* (2013.01); *H01L 21/67265* (2013.01); *H01L 21/67766* (2013.01); *H01L 21/67778* (2013.01); *H01L 21/68707* (2013.01)

(58) Field of Classification Search
  CPC ......... H01L 21/68707; H01L 21/67766; H01L 21/67259; H01L 21/67265; H01L 21/67778
  See application file for complete search history.

(56) References Cited

U.S. PATENT DOCUMENTS

| | | | | |
|---|---|---|---|---|
| 2010/0290886 | A1* | 11/2010 | Hashimoto | B25J 15/0014 414/800 |
| 2011/0160897 | A1* | 6/2011 | Shimomura | B25J 9/1692 700/217 |
| 2013/0078060 | A1* | 3/2013 | Furuichi | H01L 21/67766 414/225.01 |

FOREIGN PATENT DOCUMENTS

| | | |
|---|---|---|
| JP | 2000-124289 A | 4/2000 |
| JP | 2002-110769 A | 4/2002 |
| JP | 2005-142225 A | 6/2005 |
| JP | 2012-222195 A | 11/2012 |
| JP | 2014-130899 A | 7/2014 |
| JP | 2015-26752 A | 2/2015 |
| KR | 10-2001-0043834 A | 5/2001 |
| TW | 201230236 A1 | 7/2012 |
| WO | 99/62107 A1 | 12/1999 |

* cited by examiner

SUBSTRATE CONVEYING ROBOT AND OPERATION METHOD THEREFOR

TECHNICAL FIELD

The present invention relates to a substrate conveying robot comprising a robot arm to which an end effector having a substrate holding unit for holding a substrate is provided and its operation method.

BACKGROUND ART

Conventionally, a substrate conveying robot is used as a means for conveying a substrate such as a semiconductor wafer. The substrate conveying robot comprises an articulated robot arm and an end effector (hand) provided to a tip end of the robot arm, for example.

Usually, a plurality of wafers are stored in a substrate storing container such as a FOUP (wafer cassette). The substrate conveying robot takes a wafer to be conveyed from the inside of the substrate storing container and conveys the same to the side of a treatment apparatus for treating the wafer. Or, it takes a treated wafer from a wafer holder on the treatment apparatus side and stores the same inside the substrate storing container.

When taking a wafer from the substrate storing container or the wafer holder using the substrate conveying robot, the operation of the robot arm is controlled by a robot controller so as to insert the end effector into an interval between wafers in the vertical direction. From this state, the end effector is elevated so as to place a wafer to be conveyed on the end effector, and the wafer is fixed on the end effector by a substrate holding unit.

A heat treatment film forming apparatus used in a thermal process, for example, is given as a treatment apparatus for treating a wafer. In the heat treatment film forming apparatus, a plurality of wafers are loaded on a wafer holder configured in a multistage and the plurality of wafers are treated at the same time by a batch treatment.

In the heat treatment film forming apparatus mentioned above, a substrate pitch in the vertical direction in the wafer holder needs to be small in order to increase the number of treated wafers by the batch treatment. Also in the substrate storing container, a substrate pitch in the vertical direction in the container needs to be small in order to enhance the storing sufficiency.

As above, when a substrate pitch in the vertical direction becomes small, a position accuracy required for the robot operation when inserting the end effector of the substrate conveying robot into an interval between wafers increases.

Conventionally, a worker has performed a teaching operation (teaching) on the substrate conveying operation while confirming positions of the end effector and the wafer by sight. Therefore, much effort and time have been required for the teaching operation on the substrate conveying operation.

Note that, as a means for detecting a storing state of a plurality of wafers inside the substrate storing container, a means of scanning edge portions of a plurality of wafers using an optical sensor provided to the end effector is known. This is called mapping which can determine the presence or absence of a wafer inside the substrate storing container prior to the substrate conveying process by the substrate conveying robot.

CITATION LIST

Patent Document
[Patent Document 1] Japanese Patent Application Laid-Open No. 2000-124289

SUMMARY OF INVENTION

Objects to be Achieved by the Invention

However, the optical sensor provided to the end effector is for determining the presence or absence of a wafer inside the substrate storing container as stated above, and it is not for detecting a vertical position of a wafer. Since a mounting error of the optical sensor to the end effector occurs usually, even when a vertical position of a wafer is detected, ensuring a sufficient accuracy for detecting the position is extremely difficult or impossible.

The present invention is made considering the above-stated problems of the conventional technique, and its object is to provide a substrate conveying robot capable of detecting a vertical position of a substrate to be conveyed with high accuracy and controlling the robot operation based on the detection result, and its operation method.

Means for Achieving the Objects

In order to achieve the above-stated objects, a substrate conveying robot according to a first aspect of the present invention comprises a robot arm including an end effector having a substrate holding unit for holding a substrate, an arm drive unit for driving the robot arm, an elevating drive unit for elevatingly driving the end effector, a robot control unit for controlling the arm drive unit, the elevating drive unit, and the substrate holding unit, and a substrate detection unit for detecting a vertical position of the substrate, wherein the substrate detection unit has a substrate detection sensor elevating coordinately with an elevating operation of the end effector.

A second aspect of the invention is that, in the first aspect, the robot control unit is configured to control the elevating drive unit for raising or lowering the end effector so as to detect the substrate by the substrate detection sensor and specify a separation distance between a reference surface of the end effector and the substrate detection sensor in a vertical direction based on a vertical position of the end effector at its detection time point and a vertical position of the end effector at a time point when the substrate is held by the substrate holding unit at a normal substrate holding position.

A third aspect of the invention is that, in the first or second aspect, the reference surface of the end effector is matched with the normal substrate holding position.

A fourth aspect of the invention is that, in any one of the first to third aspects, a holding state determination unit for determining whether the substrate is held by the substrate holding unit or not is further provided.

A fifth aspect of the invention is that, in the fourth aspect, the robot control unit is configured so as to detect a time point when a determination result of the holding state determination unit is switched while raising or lowering the end effector by the elevating drive unit by a predetermined distance in order to detect a vertical position of the end effector at a time point when the substrate is held by the substrate holding unit at the normal substrate holding position.

A sixth aspect of the invention is that, in the fourth or fifth aspects, the substrate holding unit has a movable engagement portion engaged with an edge portion of the substrate releasably and a plunger for driving the movable engagement portion, and the holding state determination unit has a position sensor for detecting a position of the plunger.

A seventh aspect of the invention is that, in the fourth or fifth aspect, the substrate holding unit has a vacuum suction unit for vacuum sucking the substrate, and the holding state determination unit has a vacuum sensor which detects that a vacuum state is achieved by the vacuum suction unit.

An eighth aspect of the invention is that, in any one of the first to seventh aspects, the substrate detection sensor is provided in the end effector.

A ninth aspect of the invention is that, in any one of the first to eighth aspects, the end effector is configured so as to be elevated integrally with the robot arm, and the elevating drive unit is configured so as to elevate the end effector by elevating the robot arm.

A tenth aspect of the invention is that, in any one of the first to ninth aspects, the robot control unit is configured so as to detect a vertical position of the substrate to be conveyed by the substrate detection sensor and control the elevating drive unit based on a detection result so as to hold the substrate by the substrate holding unit.

In order to achieve the above-mentioned objects, an eleventh aspect of the present invention is an operation method of a substrate conveying robot comprising a robot arm to which an end effector having a substrate holding unit for holding a substrate is provided, comprising a detection object substrate detection process detecting the substrate to be detected using a substrate detection sensor elevating integrally with an elevating operation of the end effector, an end effector position detection process detecting a vertical position of the end effector at a time point when the substrate to be detected is held at a normal substrate holding position by the substrate holding unit, and a separation distance specifying process specifying a separation distance between the reference surface of the end effector and the substrate detection sensor in a vertical direction based on a detection result in the detection object substrate detection process and a detection result in the end effector position detection process.

A twelfth aspect of the invention is that, in the eleventh aspect, the substrate conveying robot further has a holding state determination unit for determining whether the substrate is held by the substrate holding unit or not, detecting a time point when a determination result of the holding state determination unit is switched while raising or lowering the end effector by a predetermined distance in the end effector position detection process.

A thirteenth aspect of the invention is that, in the twelfth aspect, the substrate to be detected is displaced from the normal substrate holding position at a time point when a determination result of the holding state determination unit is switched.

A fourteenth aspect of the present invention is that, in the twelfth aspect, the substrate to be detected is at the normal substrate holding position at a time point when a determination result of the holding state determination unit is switched.

A fifteenth aspect of the invention is that, in any one of the eleventh to fourteenth aspects, the reference surface of the end effector is matched with the normal substrate holding position.

A sixteenth aspect of the invention is that, in any one of the eleventh to fifteenth aspects, a conveying object substrate position detection process detecting a vertical position of the substrate to be conveyed using the substrate detection sensor based on the separation distance obtained in the separation distance specifying process is further provided.

Effect of the Invention

According to the present invention, a substrate conveying robot capable of detecting a vertical position of a substrate to be conveyed with high accuracy and controlling the robot operation based on the detection result and its operation method can be provided.

EMBODIMENT OF THE INVENTION

Hereunder, a substrate conveying robot according to an embodiment of the present invention will be described referring to the figures. Note that the substrate conveying robot according to the embodiment is particularly suitable for conveying a wafer for manufacturing a semiconductor.

Figure 1:
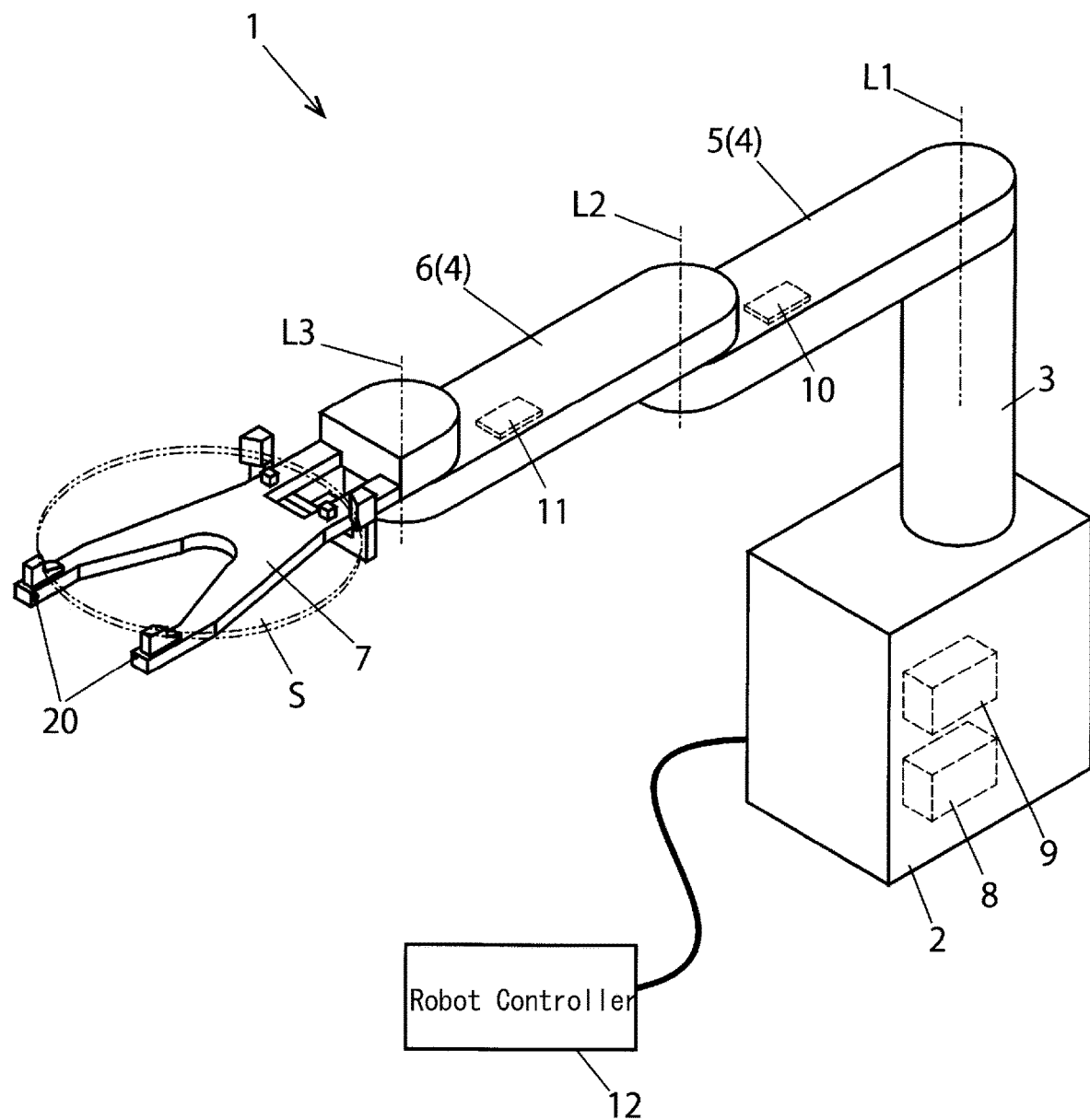
FIG. 1 is a perspective view schematically illustrating a substrate conveying robot according to an embodiment of the present invention.

As illustrated in FIG. 1, a substrate conveying robot 1 according to the embodiment has a base 2. A rotary spindle 3 is provided on the base 2 so as to elevate along a first rotational axis line L1.

The base end of a robot arm 4 is connected on the upper end of the rotary spindle 3. The robot arm 4 has a first link member 5 having the first rotational axis line L1 on the base end thereof and also having a second rotational axis line L2 on the tip end thereof, and a second link member 6 having the second rotational axis line L2 on the base end thereof and also having a third rotational axis line L3 on the tip end thereof. An end effector (hand) 7 is provided on the tip end of the second link member 6 so as to rotate about the third rotational axis line L3.

The elevating operation and the rotating operation of the rotary spindle 3 are performed by drive sources 8, 9 provided inside the base 2 respectively. The rotary spindle 3 rotates about the first rotational axis line L1 so that the first link member 5 rotates about the first rotational axis line L1 integrally with the rotary spindle 3.

The rotational operation of the second link member 6 with respect to the first link member 5 is performed by a drive source 10 provided inside the first link member 5. The rotating operation of the end effector 7 with respect to the second link member 6 is performed by a drive source 11 provided inside the second link member 6.

The above-stated drive source 8 configures an elevating drive unit in the present invention. The above-stated drive sources 9, 10, 11 configure an arm drive unit in the present invention. The drive sources 8, 9, 10, 11 can be configured by servo motors, for example.

Each drive source 8, 9, 10, 11 is controlled by a robot controller 12. Thereby, the elevating operation and the rotating operation of the robot arm 4 having the end effector 7 are controlled.

Note that a configuration of a robot arm of the substrate conveying robot according to the present invention and its drive unit is not limited to the configuration above as illustrated in FIG. 1, and any configuration capable of positioning an end effector to a substrate to be conveyed can be employed.

Figure 2:
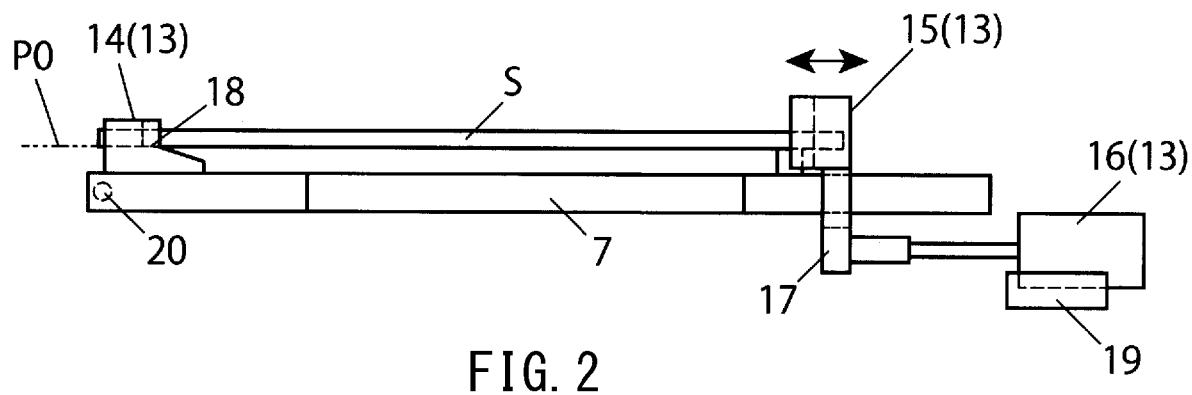
FIG. 2 is an enlarged side view schematically illustrating a part of the end effector of the substrate conveying robot in FIG. 1.
Figure 3:
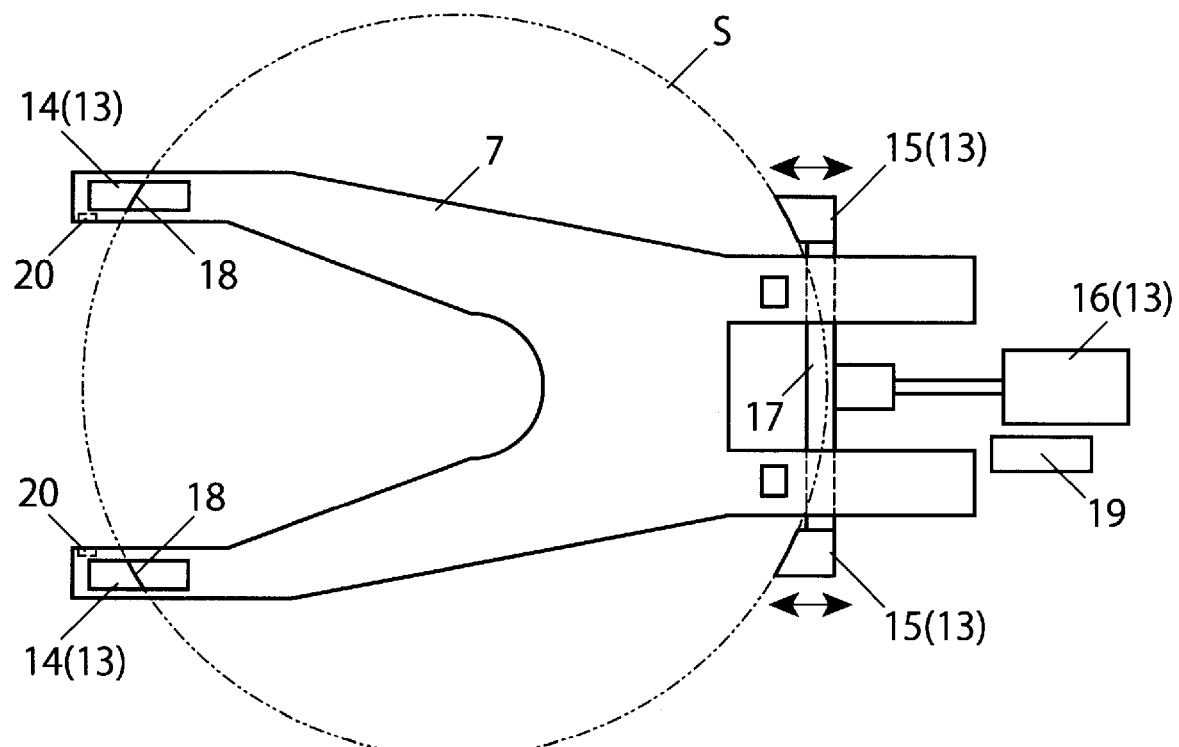
FIG. 3 is an enlarged plan view schematically illustrating the part of the end effector of the substrate conveying robot in FIG. 1.

As illustrated in FIG. 2 and FIG. 3, the substrate conveying robot 1 according to the embodiment comprises a substrate holding unit 13 for holding a substrate S on the end effector 7 thereof. The substrate holding unit 13 has a fixed engagement portion 14 engaged with an edge portion on the front side of the substrate S, a movable engagement portion 15 engaged releasably with an edge portion on the rear side of the substrate S, and a plunger 16 for driving the movable engagement portion 15 advancingly and retreatingly.

The fixed engagement portion 14 is provided to each of the tip end portions of the end effector 7 in a bifurcated shape. The movable engagement portion 15 is provided to each of both end portions of a slender member 17 extending in the direction orthogonal to the longitudinal axis line of the end effector 7 on the base end side of the end effector 7.

As illustrated in FIG. 2, a step portion 18 is formed in the fixed engagement portion 14, and the substrate S is placed on the step portion 18. In the example, a horizontal surface including the step portion 18 of the fixed engagement portion 14 is a reference surface P0 of the end effector 7. In the example, the lower surface of the substrate S held in a normal holding position of the end effector 7 is matched with the reference surface P0 of the end effector 7.

In the substrate conveying robot 1 according the embodiment, a holding state and a non-holding state of the substrate S on the end effector 7 can be switched therebetween by driving the plunger 16 advancingly and retreatingly by the robot controller 12.

As illustrated in FIG. 3, a position sensor (holding state determination unit) 19 for detecting a position of the plunger 16 is provided adjacent to the plunger 16. Whether the substrate S is held on the end effector 7 or not can be determined by the position sensor 19.

Further, the substrate conveying robot 1 according to the embodiment comprises a substrate detection sensor (substrate detection unit) 20 for detecting a vertical position of the substrate S. The substrate detection sensor 20 is an optical sensor provided inside the tip end portion of the end effector 7 in a bifurcated shape, and the optical sensor is a transmission type sensor having a light emitting portion and a light receiving portion. The light emitting portion of the optical sensor is provided to one tip end portion of the end effector 7 in a bifurcated shape, and the light receiving portion of the optical sensor is provided to the other tip end portion of the end effector 7 in a bifurcated shape.

When detecting the substrate S, a light is emitted from the light emitting portion of the optical sensor configuring the substrate detection sensor 20 toward the light receiving portion of the optical sensor. Then, if the substrate S does not exist on the way of the optical path, the light emitted from the light emitting portion is made incident on the light receiving portion and an output signal of the optical sensor is turned on. On the other hand, when the substrate S exists on the way of the optical path, the light emitted from the light emitting portion is interrupted by the substrate S, not reaching the light receiving portion, and the output signal of the optical sensor is turned off.

Note that, as a variation, a configuration that both the light emitting portion and the light receiving portion of the optical sensor are provided to one tip end portion of the end effector 7 in a bifurcated shape and a reflector is provided to the other tip end portion of the end effector 7 in a bifurcated shape can also be employed. In the configuration, if the substrate S does not exist on the optical path, the light emitted from the light emitting portion of the optical sensor is reflected by the reflector and reaches the light receiving portion of the optical sensor.

Figure 4:
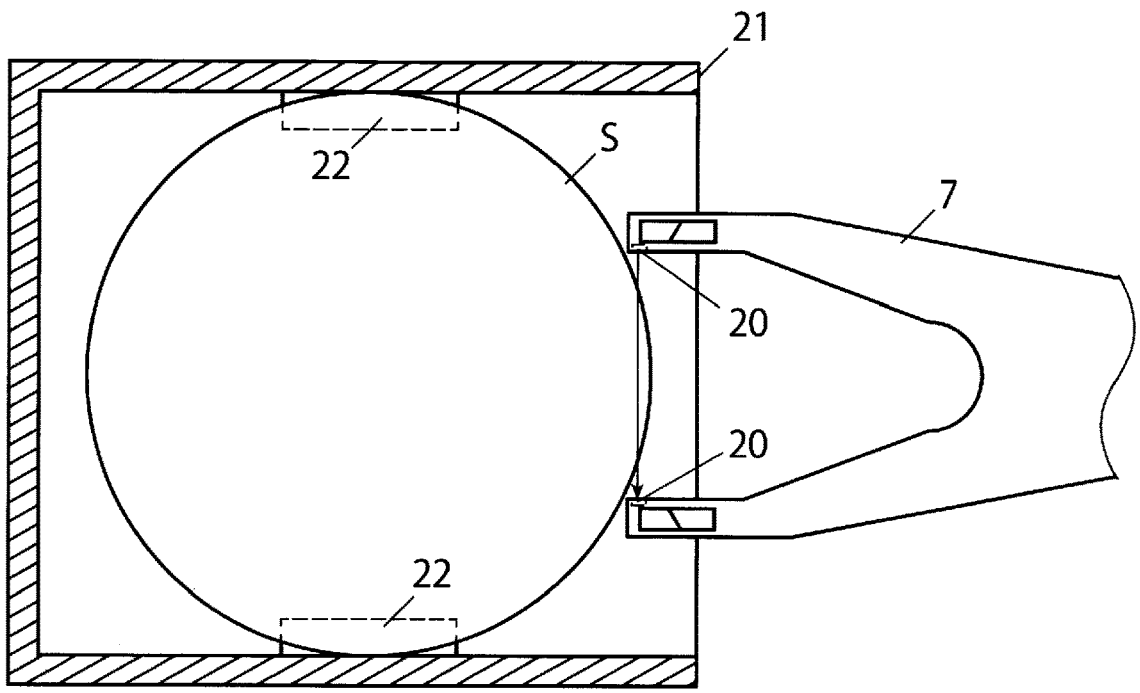
FIG. 4 is a schematic cross-section view illustrating a method for detecting a substrate using the substrate conveying robot in FIG. 1.
Figure 5:
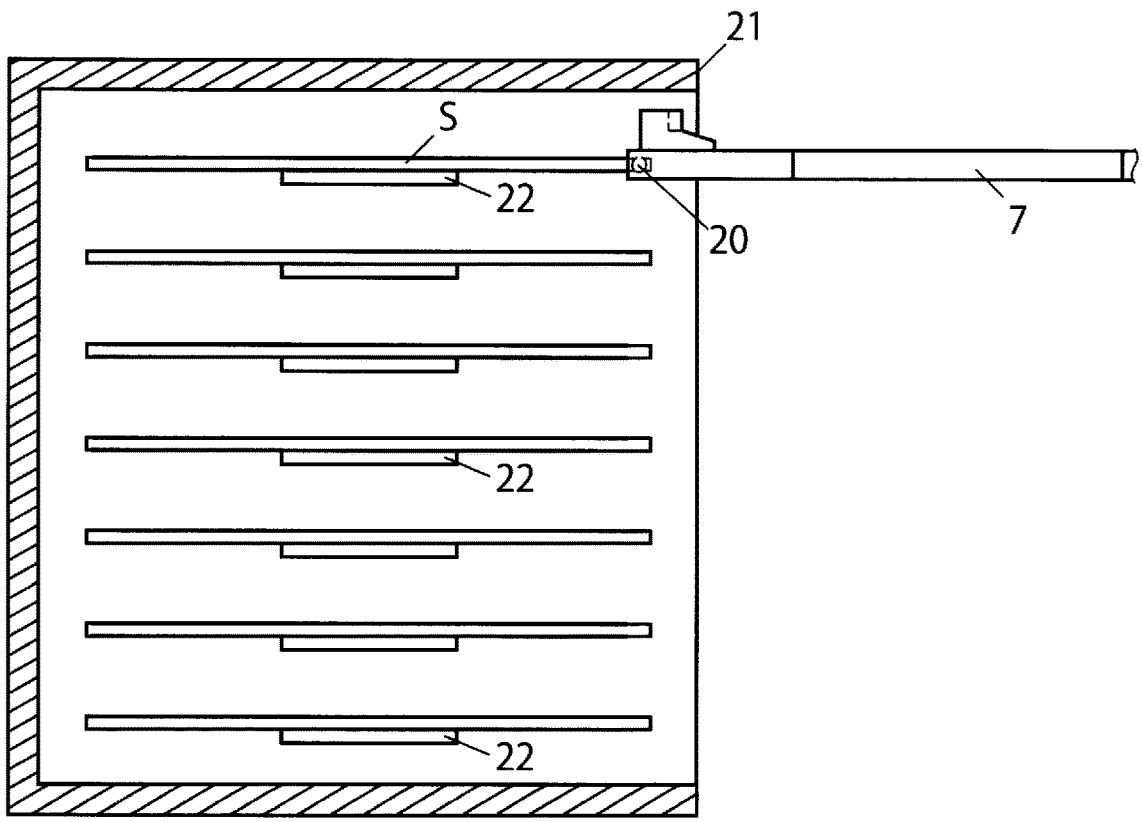
FIG. 5 is a schematic longitudinal section view illustrating the method for detecting a substrate using the substrate conveying robot in FIG. 1.

When detecting a vertical position of the substrate S supported by a substrate supporting portion 22 of a substrate storing container 21 such as a FOUP using the substrate detecting sensor 20, the elevating drive unit 8 and the arm drive unit 9, 10, 11 are driven by the robot controller 12 so that the end effector 7 is raised or lowered in the state that an edge portion of the substrate S is positioned between the left and right tip end portions of the end effector 7 as illustrated in FIG. 4 and FIG. 5.

Further, in the substrate conveying robot 1 according to the embodiment, a separation distance between the reference surface P0 of the end effector 7 and the substrate detection sensor 20 in the vertical direction is specified, and a vertical position of the substrate S can be detected by the above-described method based on the specified separation distance.

Hereunder, a method for specifying the separation distance between the reference surface P0 of the end effector 7 and the substrate detection sensor 20 in the vertical direction will be described.

Figure 6:
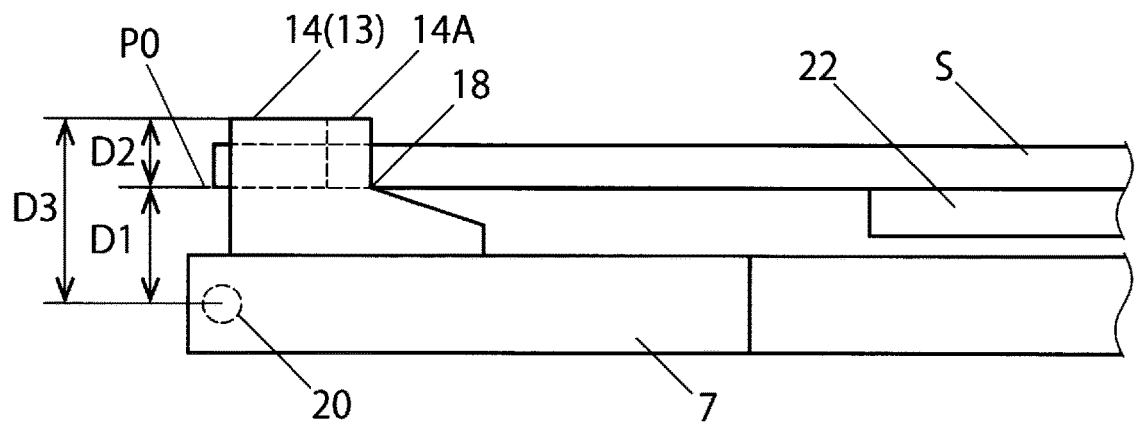
FIG. 6 is a schematic enlarged view illustrating a method for specifying a separation distance between the reference surface of the end effector and a substrate detection sensor in the vertical direction using the substrate conveying robot in FIG. 1.

As illustrated in FIG. 6, the separation distance between the reference surface P0 of the end effector 7 and the substrate detection sensor 20 in the vertical direction is D1. Here, there is an error in a mounting position of the substrate detection sensor 20 to the end effector 7. Therefore, a mounting position of the substrate detection sensor 20 has individual difference for each end effector 7. Therefore, the above-stated separation distance D1 needs to be specified in order to accurately detect a vertical position of the substrate S using the substrate detection sensor 20 of the substrate conveying robot 1.

Figure 7:
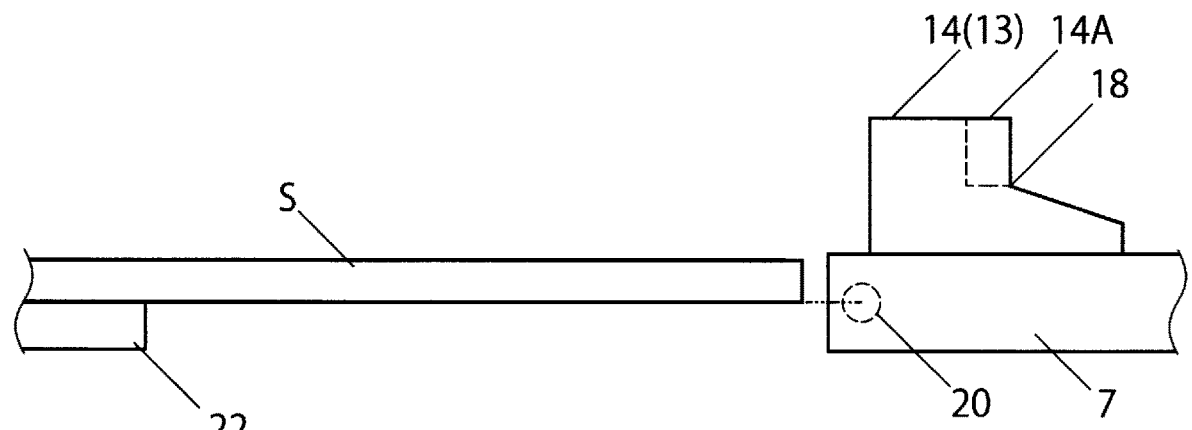
FIG. 7 is another schematic enlarged view illustrating a method for specifying a separation distance between the reference surface of the end effector and the substrate detection sensor in the vertical direction using the substrate conveying robot in FIG. 1.

Then, in the substrate conveying robot 1 according to the embodiment, first, the lower surface of the substrate S to be detected supported by the substrate supporting portion 22 of the substrate storing container 21 such as the FOUP is detected using the substrate detection sensor 20 provided in the end effector 7 as illustrated in FIG. 7 (detection object substrate detection process). Also, a vertical position of the end effector 7 at a time point when the substrate S to be detected is held by the substrate holding unit 13 is detected (end effector position detection process).

Figure 8:
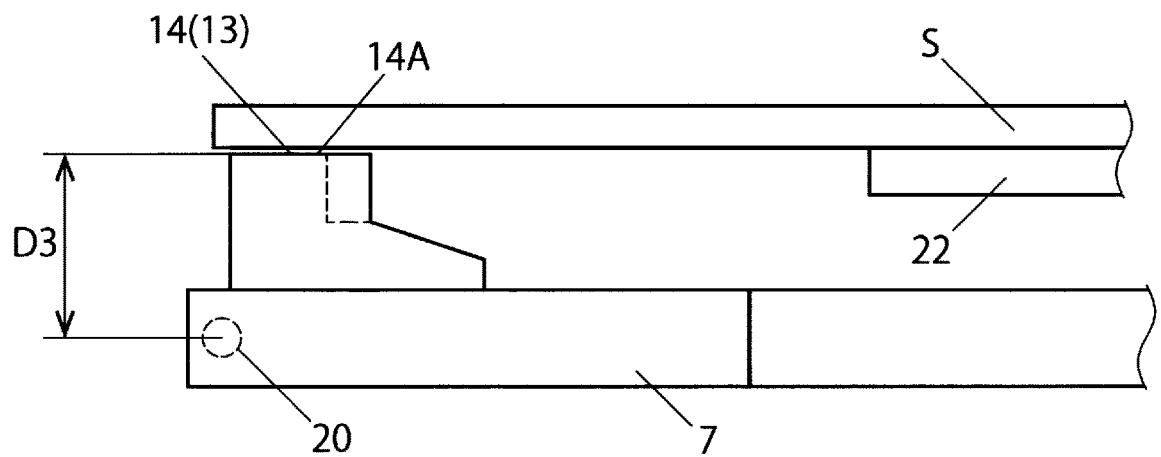
FIG. 8 is another schematic enlarged view illustrating a method for specifying a separation distance between the reference surface of the end effector and the substrate detection sensor in the vertical direction using the substrate conveying robot in FIG. 1.

In the end effector position detection process, the end effector 7 is elevatingly driven so that a vertical position of the lower surface of the substrate S is substantially matched with a position of an upper surface 14A of the fixed engagement portion 14 of the end effector 7 as illustrated in FIG. 8.

The end effector 7 needs to be lowered by a distance D3 from the state illustrated in FIG. 7 in order to make the state illustrated in FIG. 7, namely the state that the lower surface of the substrate S is detected by the substrate detection sensor 20 into the state illustrated in FIG. 8, namely the state that the lower surface of the substrate S is substantially matched with the upper surface 14A of the fixed engagement portion 14 of the end effector 7. The distance D3 is a separation distance between the upper surface 14A of the fixed engagement portion 14 and the substrate detection sensor 20 in the vertical direction.

Here, a distance D2 between the upper surface 14A of the fixed engagement portion 14 of the end effector 7 and the reference surface P0 of the end effector 7 in the vertical direction is previously known as a machining dimension. Accordingly, if the distance D3 can be identified, the separation distance D1 between the reference surface P0 of the end effector 7 and the substrate detection sensor 20 in the vertical direction can be specified by subtracting the known distance D2 from the distance D3.

The distance D3 illustrated in FIG. 6 and FIG. 8, namely the distance D3 between the upper surface 14A of the fixed engagement portion 14 and the substrate detection sensor 20 in the vertical direction can be specified by recognizing a vertical position of the end effector 7 in the state in FIG. 7 and a vertical position of the end effector 7 in the state in FIG. 8. A vertical position of the end effector 7 in the state in FIG. 7 can be detected by switching an output signal of the substrate detection sensor 20 ON and OFF when the end effector 7 is raised or lowered.

On the other hand, a vertical position of the end effector 7 in the state illustrated in FIG. 8 is detected using the method described below.

Figure 9:
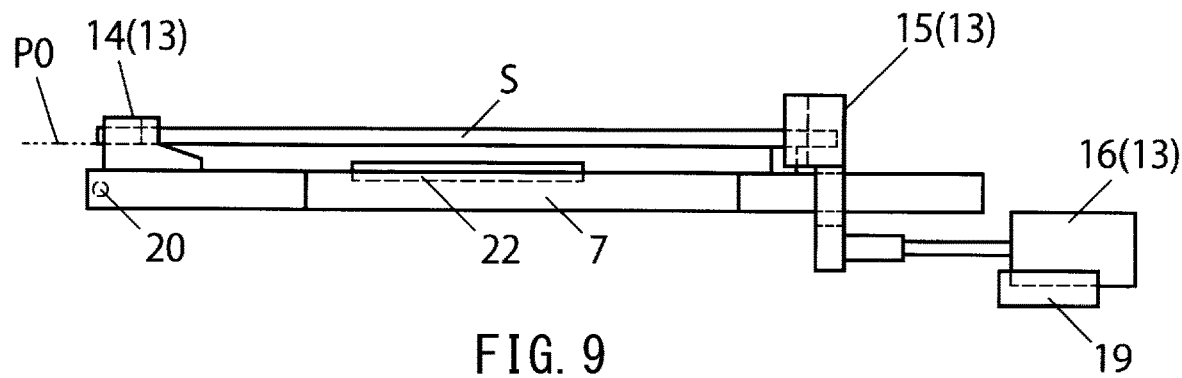
FIG. 9 is a schematic enlarged view illustrating a method for detecting a vertical position of the end effector at a time point when a substrate to be detected is held by a substrate holding unit using the substrate conveying robot illustrated in FIG. 1.
Figure 10:
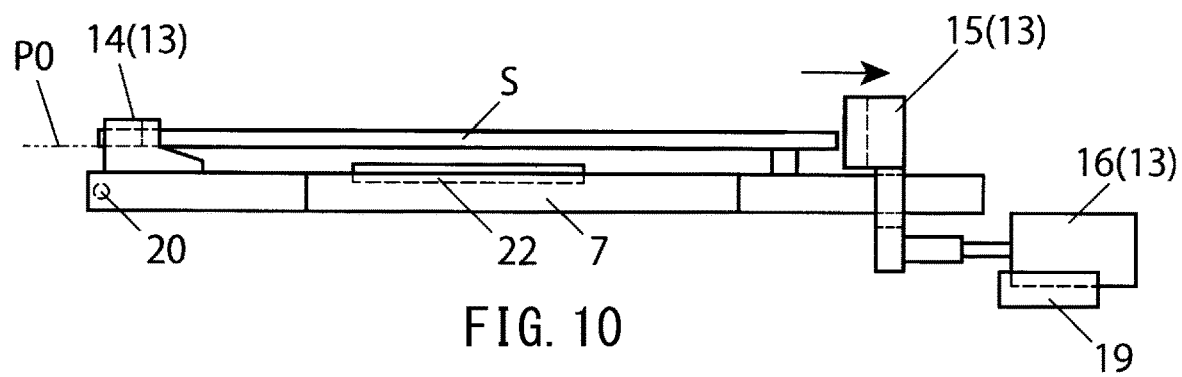
FIG. 10 is another schematic enlarged view illustrating a method for detecting a vertical position of the end effector at a time point when a substrate to be detected is held by the substrate holding unit using the substrate conveying robot illustrated in FIG. 1.
Figure 11:
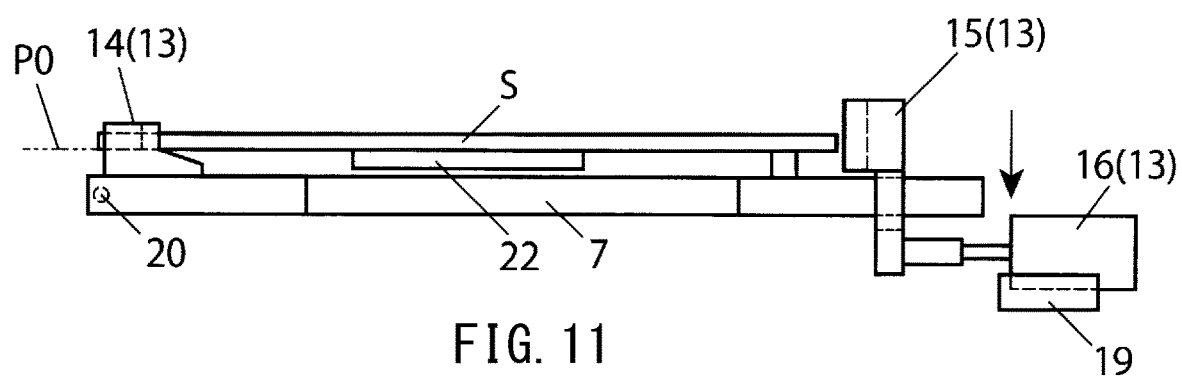
FIG. 11 is another schematic enlarged view illustrating a method for detecting a vertical position of the end effector at a time point when a substrate to be detected is held by the substrate holding unit using the substrate conveying robot illustrated in FIG. 1.

First, as illustrated in FIG. 9, the substrate S to be detected is held by the end effector 7 and lifted slightly from the substrate supporting portion 22 of the substrate storing container. From the state illustrated in FIG. 9, the movable engagement portion 15 is retreated so as to release the holding state of the substrate S by the substrate holding unit 13 as illustrated in FIG. 10. From the state illustrated in FIG. 10, the end effector 7 is slightly lowered by a predetermined distance as illustrated in FIG. 11. FIG. 11 illustrates the state that the substrate S is just placed on the substrate supporting portion 22, namely the state that the lower surface of the substrate S is positioned in the reference surface P0 of the end effector 7.

Figure 12:
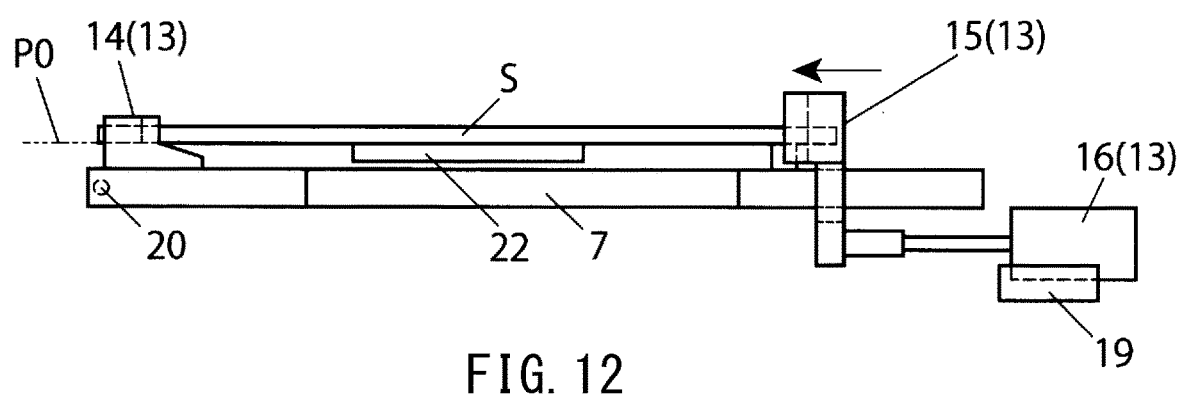
FIG. 12 is another schematic enlarged view illustrating a method for detecting a vertical position of the end effector at a time point when a substrate to be detected is held by the substrate holding unit using the substrate conveying robot illustrated in FIG. 1.
Figure 13:
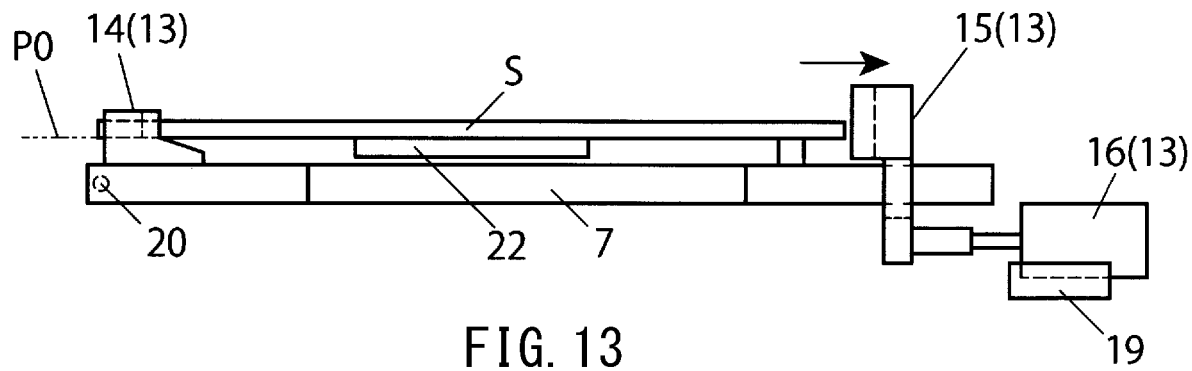
FIG. 13 is another schematic enlarged view illustrating a method for detecting a vertical position of the end effector at a time point when a substrate to be detected is held by the substrate holding unit using the substrate conveying robot illustrated in FIG. 1.
Figure 14:
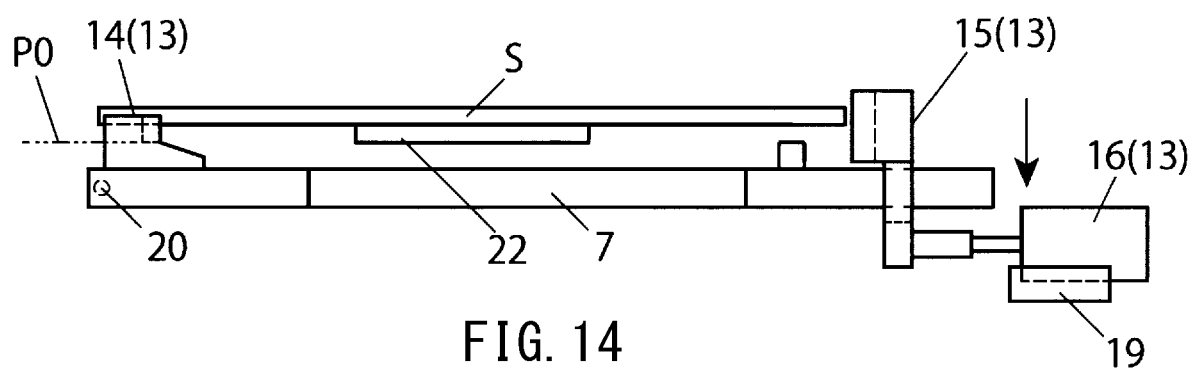
FIG. 14 is another schematic enlarged view illustrating a method for detecting a vertical position of the end effector at a time point when a substrate to be detected is held by the substrate holding unit using the substrate conveying robot illustrated in FIG. 1.

From the state illustrated in FIG. 11, the substrate holding unit 13 is driven so as to perform the substrate holding operation as illustrated in FIG. 12. As the substrate S is in the position of the reference surface P0 of the end effector 7 at this time, the substrate S is held by the substrate holding unit 13. From the state illustrated in FIG. 12, the holding state of the substrate S by the substrate holding unit 13 is released as illustrated in FIG. 13. From the state illustrated in FIG. 13, the end effector 7 is lowered by a predetermined distance as illustrated in FIG. 14. Then, as the substrate S is supported by the substrate supporting portion 22 and is not moved, the lower surface of the substrate S is in a position slightly higher than the reference surface P0 of the end effector 7, relatively.

Figure 15:
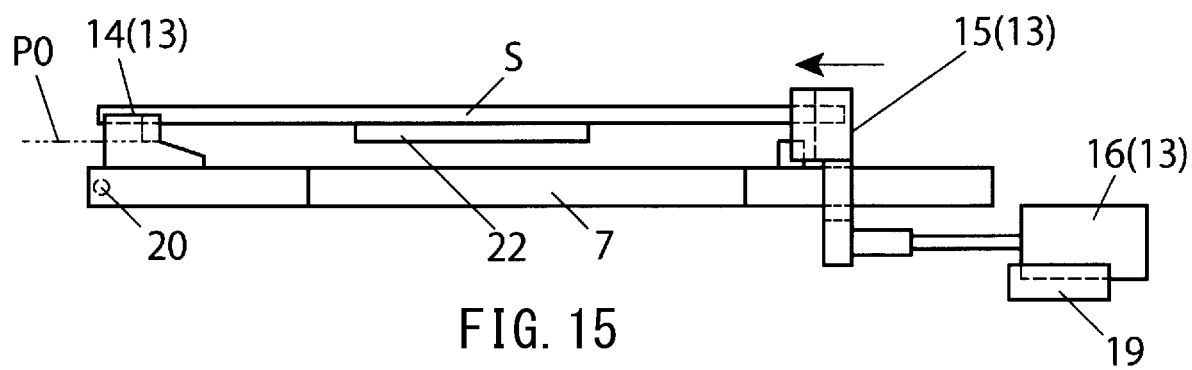
FIG. 15 is another schematic enlarged view illustrating a method for detecting a vertical position of the end effector at a time point when a substrate to be detected is held by the substrate holding unit using the substrate conveying robot illustrated in FIG. 1.

From the state illustrated in FIG. 14, the substrate holding unit 13 is driven so as to perform the substrate holding operation as illustrated in FIG. 15. At this time, the lower surface of the substrate S is in a position higher than the reference surface P0 of the end effector 7 but lower than the upper surface 14A of the fixed engagement portion 14, and therefore the substrate S is held by the substrate holding unit 13.

Figure 16:
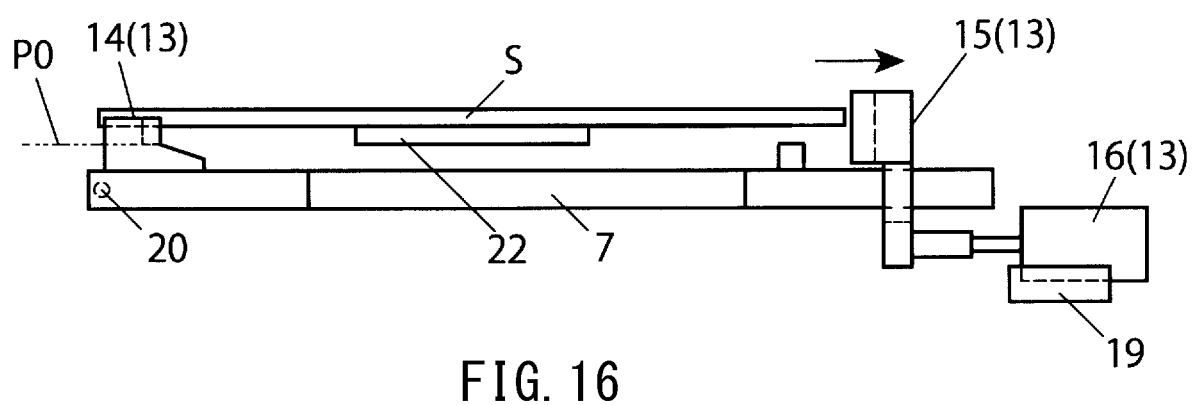
FIG. 16 is another schematic enlarged view illustrating a method for detecting a vertical position of the end effector at a time point when a substrate to be detected is held by the substrate holding unit using the substrate conveying robot illustrated in FIG. 1.
Figure 17:
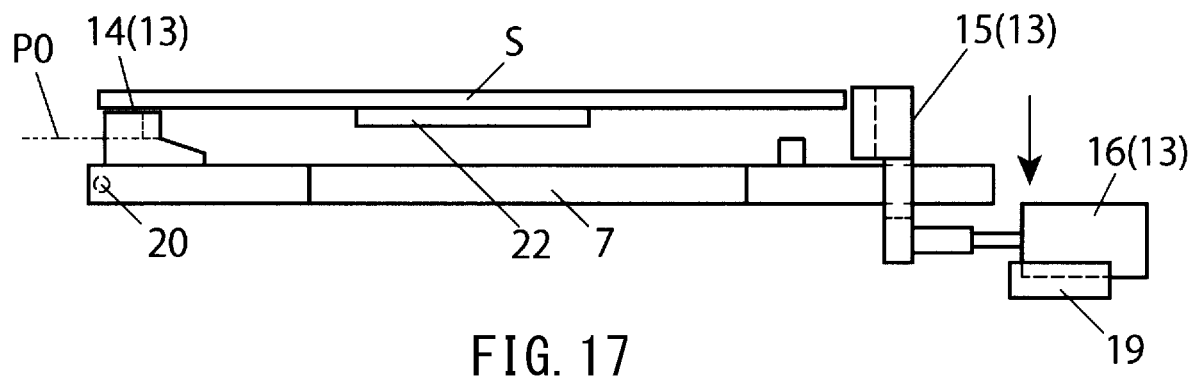
FIG. 17 is another schematic enlarged view illustrating a method for detecting a vertical position of the end effector at a time point when a substrate to be detected is held by the substrate holding unit using the substrate conveying robot illustrated in FIG. 1.

From the state illustrated in FIG. 15, the holding state of the substrate S by the substrate holding unit 13 is released as illustrated in FIG. 16, and the end effector 7 is lowered slightly by a predetermined distance as illustrated in FIG. 17. In the state illustrated in FIG. 17, a vertical position of the lower surface of the substrate S is substantially matched with a vertical position of the upper surface 14A of the fixed engagement portion 14.

Figure 18:
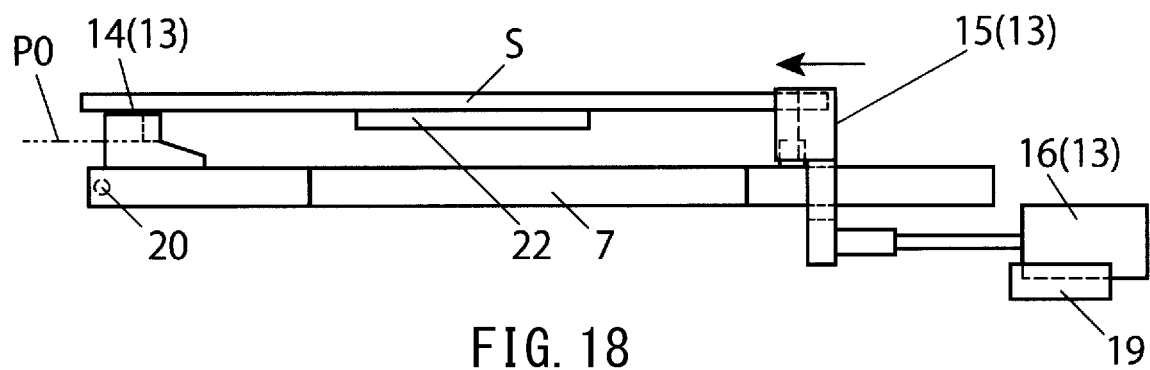
FIG. 18 is another schematic enlarged view illustrating a method for detecting a vertical position of the end effector at a time point when a substrate to be detected is held by the substrate holding unit using the substrate conveying robot illustrated in FIG. 1.

From the state illustrated in FIG. 17, the substrate holding unit 13 is driven so as to perform the substrate holding operation as illustrated in FIG. 18. As a vertical position of the lower surface of the substrate S is substantially matched with a vertical position of the upper surface 14A of the fixed engagement portion 14 as stated above at this time, the substrate S pressed by the movable engagement portion 15 of the substrate holding unit 13 is displaced forward and goes on the upper surface 14A of the fixed engagement portion 14 as illustrated in FIG. 18.

Here, a position of the plunger configuring the substrate holding unit is detected by the position sensor (holding state determination unit), and the position sensor detects that the plunger advances exceeding a predetermined position in the substrate holding state in the state illustrated in FIG. 18. Thereby, it can be detected that the substrate is in a non-holding state.

If a vertical position of the end effector 7 at a time point when the substrate holding state is switched into the substrate non-holding state (FIG. 18) is detected by a series of actions above, a position above the detection position by the distance D2 illustrated in FIG. 6 can be specified as a position of the end effector 7 at a time point when the substrate S to be detected is held at the normal substrate holding position (position of reference surface P0) by the substrate holding unit 15 (end effector position detection process).

Next, the separation distance D1 between the reference surface P0 of the end effector 7 and the substrate detection sensor 20 in the vertical direction is specified based on a detection result in the detection object substrate detection process using the substrate detection sensor 20 and a detection result in the end effector position detection process (separation distance specifying process). Namely, D1=D3−D2 is established.

Also, the robot controller 12 of the substrate conveying robot 1 according to the embodiment detects a vertical position of the substrate S to be conveyed using the substrate detection sensor 20 based on the separation distance D1 obtained in the separate distance specifying process (conveying object substrate position detection process). The elevating drive unit 8 is controlled based on a detection result by the substrate detection sensor 20 so as to hold the substrate S by the substrate holding unit 15.

Figure 19:
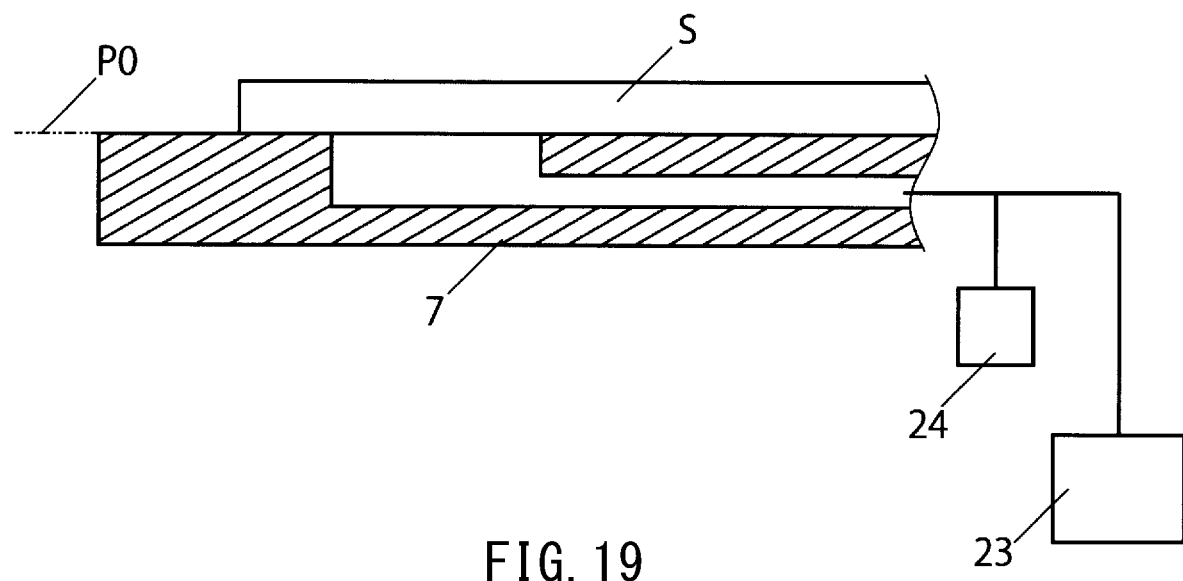
FIG. 19 is an enlarged view schematically illustrating a substrate holding unit according to a variation of the substrate conveying robot illustrated in FIG. 1.

As a variation of the embodiment above, the substrate holding unit can be configured by a vacuum suction unit 23 for vacuum sucking the substrate S, and the holding state determination unit can be configured by a vacuum sensor 24 detecting that the vacuum state is achieved by the vacuum suction unit 23 as illustrated in FIG. 19.

As the fixed engagement portion (FIG. 2, etc.) in the above-stated embodiment is not provided to the end effector 7 in the example, a suction surface according to the vacuum suction unit 23 corresponds to the reference surface P0 of the end effector 7.

Figure 20:
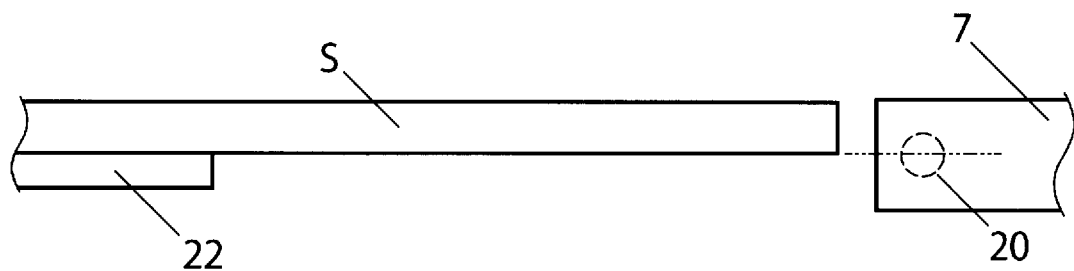
FIG. 20 is a schematic enlarged view illustrating a method for specifying a separation distance between the reference surface of the end effector and the substrate detection sensor in the vertical direction using the substrate conveying robot illustrated in FIG. 19.

Even in the example, first, the lower surface of the substrate S to be detected held by the substrate supporting portion 22 of the substrate storing container 21 is detected using the substrate detection sensor 20 provided in the end effector 7 as illustrated in FIG. 20 (detection object substrate detection process) as well as the above-stated embodiment.

Figure 21:
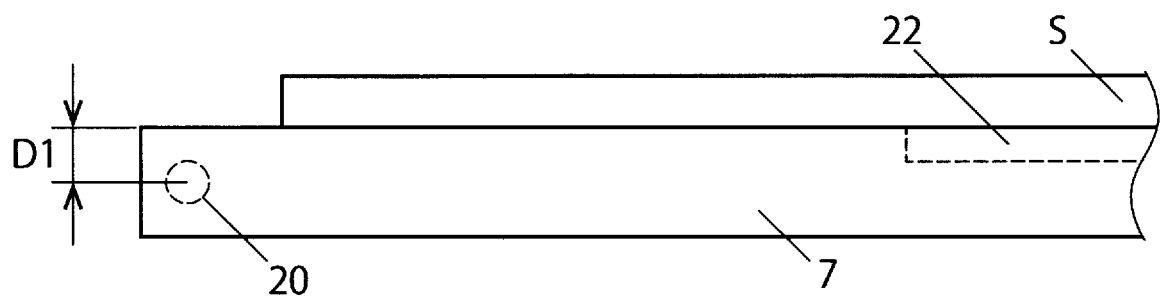
FIG. 21 is another schematic enlarged view illustrating a method for specifying a separation distance between the reference surface of the end effector and the substrate detection sensor in the vertical direction using the substrate conveying robot illustrated in FIG. 19.

Also in the example, a vertical position of the end effector 7 at a time point when the substrate S to be detected is held by the vacuum suction unit (substrate holding unit) 23 is detected as illustrated in FIG. 21 (end effector position detection process) as well as the above-stated embodiment.

As the suction surface according to the vacuum suction unit 23 corresponds to the reference surface P0 of the end effector in the example, the substrate S to be detected is in the normal substrate holding position in the end effector 7 at a time point when a determination result of the vacuum sensor (holding state determination unit) 24 is switched. Therefore, as illustrated in FIG. 21, the separation distance D1 from the reference surface P0 of the end effector 7 to the substrate detection sensor 20 in the vertical direction can be directly specified from a vertical position of the end effector 7 at a time point when the substrate S to be detected is held by the vacuum suction unit (substrate holding unit) 23.

A method for detecting a vertical position of the end effector 7 at a time point when the substrate S to be detected is held by the vacuum suction unit (substrate holding unit) 23 in the example will be described referring to FIG. 22 to FIG. 24.

Figure 22:
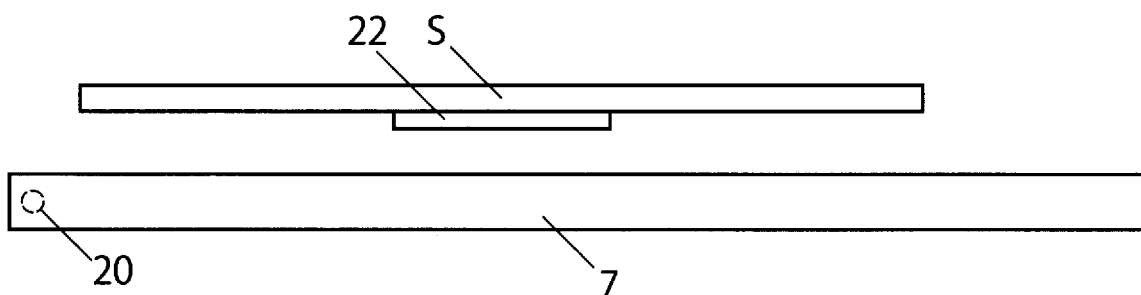
FIG. 22 is a schematic enlarged view illustrating a method for detecting a vertical position of the end effector at a time point when a substrate to be detected is held by the substrate holding unit using the substrate conveying robot illustrated in FIG. 19.

First, as illustrated in FIG. 22, the end effector 7 is positioned in a position separate from the substrate S below the substrate S supported by the substrate supporting portion 22 of the substrate storing container 21. From the state illustrated in FIG. 22, the end effector 7 is slightly raised by a predetermined distance as illustrated in FIG. 23 so as to drive the vacuum suction unit (substrate holding unit) 23. As the suction surface (reference surface P0) of the end effector 7 is separated from the lower surface of the substrate S in the state illustrated in FIG. 23, the vacuum state is not achieved and the output signal of the vacuum sensor 24 is off.

Figure 23:
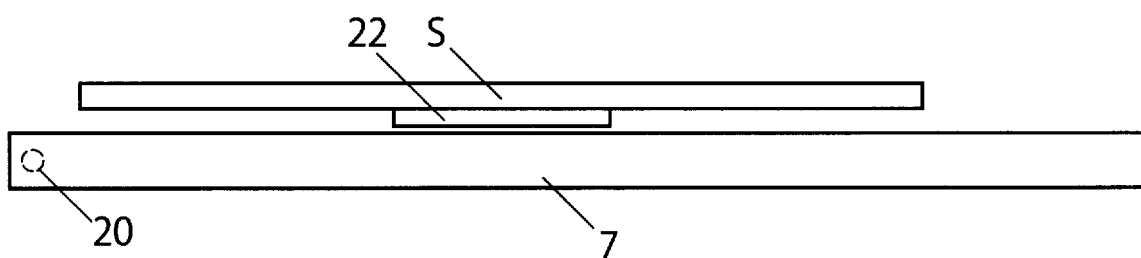
FIG. 23 is another schematic enlarged view illustrating a method for detecting a vertical position of the end effector at a time point when a substrate to be detected is held by the substrate holding unit using the substrate conveying robot illustrated in FIG. 19.
Figure 24:
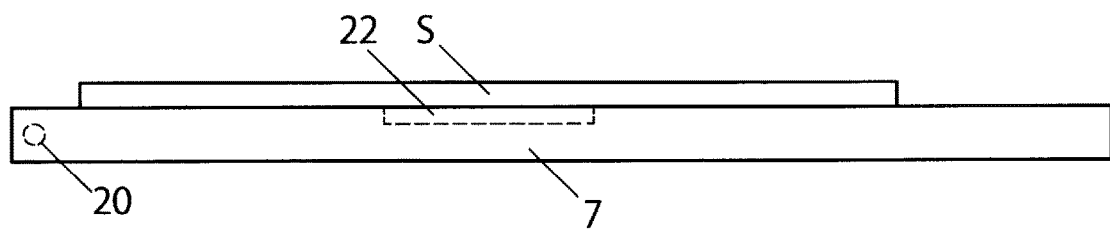
FIG. 24 is another schematic enlarged view illustrating a method for detecting a vertical position of the end effector at a time point when a substrate to be detected is held by the substrate holding unit using the substrate conveying robot illustrated in FIG. 19.

From the state illustrated in FIG. 23, the end effector 7 is slightly raised by a predetermined distance as illustrated in FIG. 24 so as to drive the vacuum suction unit 23. As the suction surface (reference surface P0) of the end effector 7 reaches the lower surface of the substrate S in the state illustrated in FIG. 24, the vacuum state is achieved by the vacuum suction unit 23 and the output signal of the vacuum sensor 24 is turned on.

As mentioned above, a vertical position of the end effector 7 at a time point when holding the substrate S to be detected by the vacuum suction unit (substrate holding unit) 23 can be detected by detecting a time point when the output signal of the vacuum sensor 24 is switched from off to on while bringing the end effector 7 close to the substrate S by a predetermined distance little by little.

Figure 25:
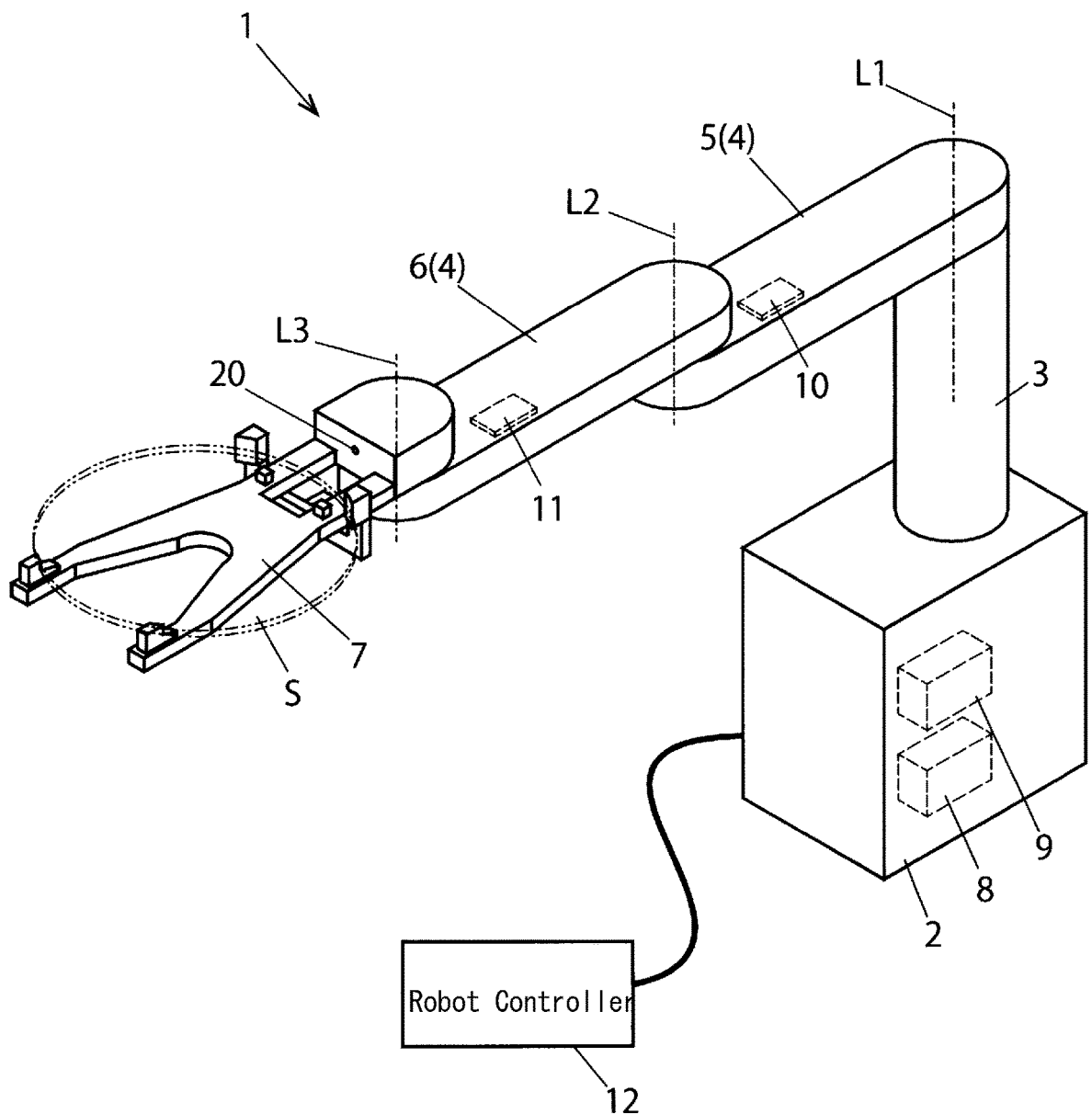
FIG. 25 is a perspective view schematically illustrating another variation of the substrate conveying robot illustrated in FIG. 1.
Figure 26:
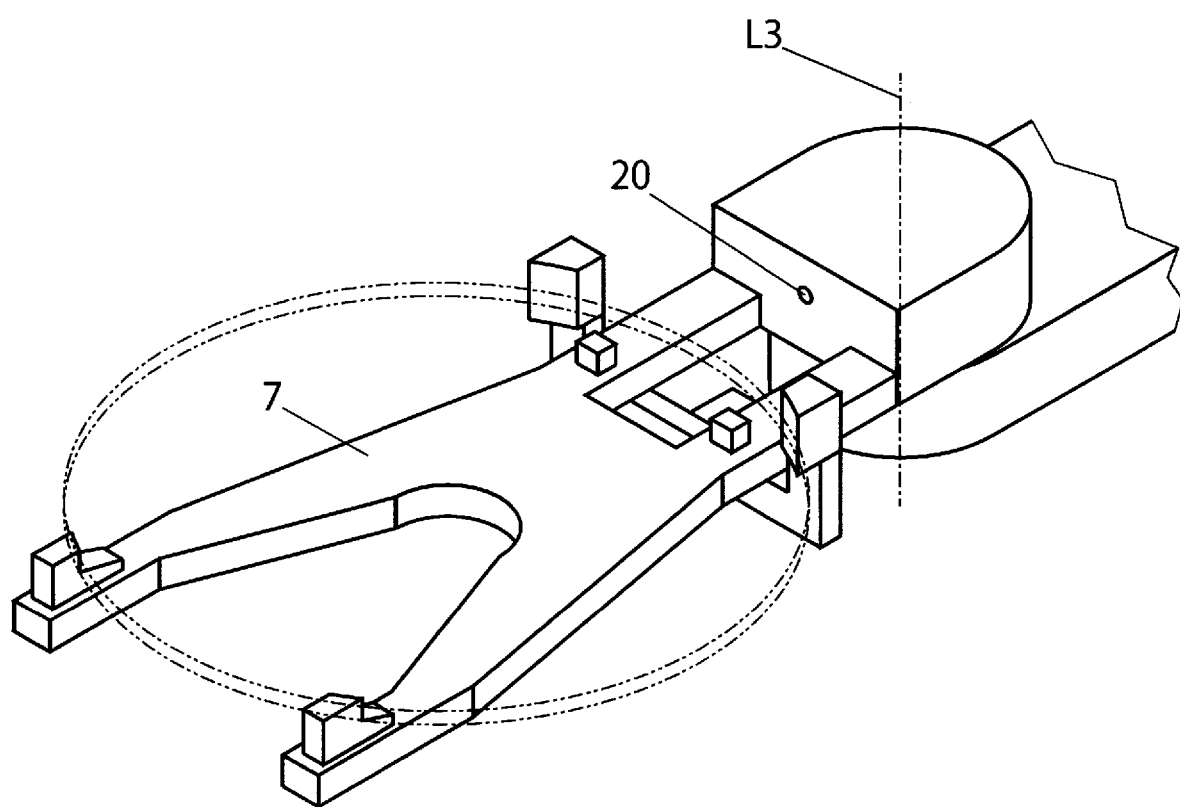
FIG. 26 is an enlarged perspective view illustrating a part of the end effector of the substrate conveying robot illustrated in FIG. 25.

FIG. 25 and FIG. 26 illustrate another variation of the above-stated embodiment, and the substrate detection sensor 20 is provided to the base end portion of the end effector 7 not to the tip end portion of the end effector 7 in the example. The substrate detection sensor 20 in the example is a reflection type optical sensor, for example, which detects a position of the substrate S by detecting a light emitted from a light emitting portion and reflected at a peripheral surface of the substrate S at a light receiving portion.

As the substrate detection sensor 20 is raised integrally with the end effector 7 even in the example, the separation distance D1 between the reference surface P0 of the end effector 7 and the substrate detection sensor 20 in the vertical direction can be specified as well as in the above-stated embodiment or variation.

As stated above, according to the above-stated embodiments and the respective variations thereof, the substrate detection sensor (substrate detection unit) 20 for detecting a vertical position of the substrate S is comprised. Therefore, the holding operation of the substrate S by the substrate conveying robot 1 can be performed with high accuracy by detecting a vertical position of the substrate S to be conveyed using the substrate detection sensor 20 prior to the holding operation of the substrate S by the end effector 7.

For example, when a supporting structure (formed of quartz, and the like) storing a plurality of substrates S is heated in a heat treatment device in the semiconductor manufacturing process, the supporting structure after treatment is sometimes deformed due to heat. Even in such a case, the holding operation of the substrate S by the substrate conveying robot 1 can be performed with high accuracy by detecting a vertical position of the substrate S stored in the supporting structure using the substrate detection sensor 20 before taking the treated substrate S out of the supporting structure by the substrate conveying robot 1.

Also, according to the above-stated embodiments and the respective variations thereof, the separation distance D1 of the substrate detection sensor 20 with respect to the reference surface P0 of the end effector 7 in the vertical direction can be specified. Therefore, a vertical position of the substrate S can be detected accurately using the substrate detection sensor 20 even when a position of the substrate detection sensor 20 with respect to the reference surface P0 of the end effector 7 has a mounting error.

For example, when a wafer mapping sensor only for detecting the presence and absence of a wafer is provided to an end effector, a position of the sensor with respect to the reference surface of the end effector has a mounting error. However, even in the case, a vertical direction of the wafer can be detected accurately using the sensor by applying the above-stated embodiments and the respective variations thereof.

Also, according to the above-stated embodiments and the respective variations thereof, the substrate detection sensor 20 is elevated integrally with the elevating operation of the end effector 7. Therefore, a relative position relation between the end effector 7 and the substrate detection sensor 20 in the vertical direction is known, and an equipment configuration and arithmetic process can be simpler compared to the case when a separate substrate detection sensor independent from the elevating operation of the end effector 7 is used.

Note that, in the invention, the mounting position of the substrate detection sensor does not necessarily need to be a position on the end effector, and the substrate detection sensor may be mounted on a part which is elevated integrally with the elevating operation of the end effector in the substrate conveying robot.

Also, in the present invention, a substrate to be detected in the detection object substrate detection process and the end effector position detection process does not necessarily need to a substrate supported by a substrate supporting portion of a substrate storing container such as a FOUP used in the actual substrate treatment process, and it may be supported by any substrate supporting portion.

Also, in the present invention, a performing order of the detection object substrate detection process and the end effector position detection process does not need to be considered. Namely, the end effector position detection process may be performed after performing the detection object substrate detection process, and vice versa.

Also, in the present invention, the reference surface of the end effector does not necessarily need to be matched with the normal substrate holding position, and it may be in any position which can be specified in the robot coordinate.

DESCRIPTION OF REFERENCE NUMERALS

1 . . . substrate conveying robot
2 . . . base
3 . . . rotary spindle
4 . . . robot arms
5 . . . first link member
6 . . . second link member
7 . . . end effector (hand)
8 . . . drive source for elevating operation of rotary spindle (elevating drive unit)
9 . . . drive source for rotational operation of rotary spindle and first link member (arm drive unit)
10 . . . drive source of rotational operation of second link member (arm drive unit)
11 . . . drive source for rotational operation of end effector (arm drive unit)
12 . . . robot controller (robot control unit)
13 . . . substrate holding unit
14 . . . fixed engagement portion (substrate holding unit)
14A . . . upper surface of fixed engagement portion
15 . . . movable engagement portion (substrate holding unit)
16 . . . plunger (substrate holding unit)
17 . . . slender member (substrate holding unit)
18 . . . step portion of fixed engagement portion
19 . . . position sensor (holding state determination unit)
20 . . . substrate detection sensor (substrate detection unit)
21 . . . substrate storing container
22 . . . substrate supporting portion of substrate storing container
23 . . . vacuum suction unit (substrate holding unit)
24 . . . vacuum sensor (holding state determination unit)
L1 . . . first rotational axis line
L2 . . . second rotational axis line
L3 . . . third rotational axis line
P0 . . . reference surface of end effector (normal holding position of substrate)
S . . . substrate

The invention claimed is:

1. A substrate conveying robot comprising:
   a robot arm including an end effector having a substrate holder for holding a substrate;
   an arm drive unit comprising one or more motors for driving the robot arm;
   an elevating drive unit comprising a motor for elevatingly driving the end effector;
   a robot controller for controlling the arm drive unit, the elevating drive unit, and the substrate holder; and
   a substrate detection unit for detecting a vertical position of the substrate, the substrate detection unit comprising a substrate detection sensor which elevates coordinately with an elevating operation of the end effector, wherein
   the robot controller is configured to control the elevating drive unit for raising or lowering the end effector so as to detect the substrate by the substrate detection sensor and specify a separation distance between a reference surface of the end effector and the substrate detection sensor in a vertical direction, the separation distance specified by subtracting a distance between an upper surface of a fixed engagement portion of the end effector and the reference surface in the vertical direction from a distance between the upper surface of the fixed engagement portion and the substrate detection sensor in the vertical direction, the distance between the upper surface of the fixed engagement portion and the substrate detection sensor being obtained based on a vertical position of the end effector at a detection time point when the substrate, which is stored in a container, is detected by the substrate detection sensor and a vertical position of the end effector at a time point when the substrate, which is stored in the container, is matched with the upper surface of the fixed engagement portion.

2. The substrate conveying robot according to claim 1, wherein the reference surface of the end effector is matched with the normal substrate holding position.

3. The substrate conveying robot according to claim 1, further comprising a position sensor for determining whether the substrate is held by the substrate holder or not.

4. The substrate conveying robot according to claim 3, wherein the robot controller is configured to detect a time point when a determination result of the position sensor is switched while raising or lowering the end effector by the elevating drive unit by a predetermined distance each in order to detect the vertical position of the end effector at the time point when the substrate, which is stored in the container, is matched with the upper surface of the fixed engagement portion.

5. The substrate conveying robot according to claim 3, wherein the substrate holder has a movable engagement portion which is to be engaged with an edge portion of the substrate releasably and a plunger for driving the movable engagement portion, and
   wherein the position sensor detects a position of the plunger.

6. The substrate conveying robot according to claim 1, wherein the substrate detection sensor is provided to the end effector.

7. The substrate conveying robot according to claim 1, wherein the end effector is configured to be elevated integrally with the robot arm, and wherein the elevating drive unit is configured to elevate the end effector by elevating the robot arm.

8. The substrate conveying robot according to claim 1, wherein the robot controller is configured to detect a vertical position of the substrate to be conveyed by the substrate detection sensor and control the elevating drive unit based on a detection result so as to hold the substrate by the substrate holder.

9. An operation method of a substrate conveying robot comprising a robot arm to which an end effector having a substrate holder for holding a substrate is provided, comprising:
   a detection object substrate detection process of detecting the substrate to be detected using a substrate detection sensor which elevates coordinately with an elevating operation of the end effector;
   an end effector position detection process of detecting a vertical position of the end effector at a time point when the substrate to be detected is held at a normal substrate holding position by the substrate holder; and
   a separation distance specifying process of specifying a separation distance between a reference surface of the end effector and the substrate detection sensor in a vertical direction, the separation distance specified by subtracting a distance between an upper surface of a fixed engagement portion of the end effector and the reference surface in the vertical direction from a distance between the upper surface of the fixed engagement portion and the substrate detection sensor in the vertical direction, the distance between the upper surface of the fixed engagement portion and the substrate detection sensor being obtained based on a vertical position of the end effector at a detection time point when the substrate, which is stored in a container, is detected by the substrate detection sensor and a vertical position of the end effector at a time point when the substrate, which is stored in the container, is matched with the upper surface of the fixed engagement portion.

10. The operation method of a substrate conveying robot according to claim 9, wherein the substrate conveying robot further has a position sensor for determining whether the substrate is held by the substrate holder or not, and
    wherein, in the end effector position detection process, a time point when a determination result of the position sensor is switched is detected while raising or lowering the end effector by a predetermined distance each.

11. The operation method of a substrate conveying robot according to claim 10, wherein the substrate to be detected is displaced from the normal substrate holding position at a time point when a determination result of the position sensor is switched.

12. The operation method of a substrate conveying robot according to claim 9, wherein the reference surface of the end effector is matched with the normal substrate holding position.

13. The operation method of a substrate conveying robot according to claim 9, further comprising a conveying object substrate position detection process of detecting a vertical position of the substrate to be conveyed using the substrate detection sensor based on the separation distance obtained in the separation distance specifying process.

* * * * *